(12) United States Patent  
Jia

(10) Patent No.: US 10,573,813 B2
(45) Date of Patent: Feb. 25, 2020

(54) METHOD FOR MANUFACTURING AN OLED DEVICE AND METHOD FOR MANUFACTURING AN OLED DISPLAY PANEL

(71) Applicants: BOE Technology Group Co., Ltd., Beijing (CN); Hefei Xinsheng Optoelectronics Technology Co., Ltd., Anhui (CN)

(72) Inventor: Wenbin Jia, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/129,217

(22) Filed: Sep. 12, 2018

(65) Prior Publication Data

US 2019/0296239 A1 Sep. 26, 2019

(30) Foreign Application Priority Data

Mar. 20, 2018 (CN) .......................... 2018 1 0229599

(51) Int. Cl.
*H01L 51/00* (2006.01)
*H01L 51/56* (2006.01)
(Continued)

(52) U.S. Cl.
CPC ...... *H01L 51/0007* (2013.01); *H01L 27/3246* (2013.01); *H01L 51/0005* (2013.01);
(Continued)

(58) Field of Classification Search
None
See application file for complete search history.

(56) References Cited

U.S. PATENT DOCUMENTS 9,466,650 B2 10/2016 Wang et al.
10,079,342 B2 9/2018 Watanabe et al.
(Continued)

FOREIGN PATENT DOCUMENTS

CN 104241329 A 12/2014
CN 105244454 A 1/2016
(Continued)

OTHER PUBLICATIONS

First Office Action dated Jun. 6, 2019; Corresponding to Chinese Application No. 201810229599.4; English Translation Attached.

*Primary Examiner* — Herve-Louis Y Assouman
(74) *Attorney, Agent, or Firm* — Nath, Goldberg & Meyer; Joshua B. Goldberg; Daniel J. Bissing

(57) ABSTRACT

Disclosed are a method for manufacturing an OLED device and an OLED device obtained by the method, and a method for manufacturing a display panel and a display panel obtained by the method, which can solve the problem that the film thickness of an organic functional layer in the existing OLED device is uneven. The method for manufacturing the OLED device includes: forming a pixel defining layer on a substrate and forming accommodating portions in the pixel defining layer; adding ink to the accommodating portions to form an organic functional layer, wherein the ink includes a first organic solvent and a second organic solvent; and the first organic solvent and the second organic solvent have the same kind of lyophilic property or lyophobic property, and the first organic solvent and the second organic solvent have different boiling points and different degrees of lyophilic property or lyophobic property.

15 Claims, 2 Drawing Sheets

(51) Int. Cl.
*H01L 27/32* (2006.01)
*H01L 51/50* (2006.01)

(52) U.S. Cl.
CPC ...... *H01L 51/0028* (2013.01); *H01L 51/5012* (2013.01); *H01L 51/56* (2013.01); *H01L 2251/301* (2013.01)

(56) References Cited

U.S. PATENT DOCUMENTS

| | | | |
|---|---|---|---|
| 10,125,282 B2 | 11/2018 | Watanabe | |
| 2007/0172979 A1* | 7/2007 | Uchino | H01L 51/0005 438/99 |
| 2017/0179388 A1* | 6/2017 | Ohta | H01L 51/0005 |

FOREIGN PATENT DOCUMENTS

| | | |
|---|---|---|
| CN | 105529409 A | 4/2016 |
| CN | 106905766 A | 6/2017 |
| CN | 107431137 A | 12/2017 |

* cited by examiner

METHOD FOR MANUFACTURING AN OLED DEVICE AND METHOD FOR MANUFACTURING AN OLED DISPLAY PANEL

PRIORITY APPLICATION

The present application claims priority to Chinese Patent Application No. 201810229599.4 filed on Mar. 20, 2018 entitled "METHOD FOR MANUFACTURING AN OLED DEVICE AND METHOD FOR MANUFACTURING AN OLED DISPLAY PANEL", which is incorporated herein by reference in its entirety.

TECHNICAL FIELD

The present disclosure relates to the field of display technology, and in particular, to ink for an organic electroluminescent device (OLED) device, a method for manufacturing an OLED device and the obtained OLED device, and a method for manufacturing an OLED display panel and the obtained OLED display panel.

BACKGROUND

At present, as for an OLED display substrate, an organic functional layer of the OLED display substrate is usually formed by a process such as inkjet printing. However, in the prior art, the layer formed by the ink after drying has an uneven structure (i.e., a coffee ring structure), in which the edge is thick and the middle is thin. The organic functional layer with uneven thickness is likely to cause uneven illumination of sub-pixels, thereby affecting the service life of an OLED display panel.

SUMMARY OF THE INVENTION

The present disclosure aims at solving at least one of the technical problems in the prior art and providing ink capable of improving the film thickness uniformity of an organic functional layer, an OLED device including an organic functional layer formed by the ink and a method for manufacturing the same, and a display panel including the OLED device and a method for manufacturing the same.

The present disclosure provides ink for an OLED device, including a first organic solvent and a second organic solvent, wherein the first organic solvent and the second organic solvent have the same kind but different degrees of lyophilic property or lyophobic property, and the first organic solvent and the second organic solvent have different boiling points.

The present disclosure further provides a method for manufacturing an OLED device, including:

forming a pixel defining layer on a substrate and forming an accommodating portion in the pixel defining layer;

adding ink comprising a first organic solvent and a second organic solvent to the accommodating portion to form an organic functional layer of the OLED device;

wherein, when the first organic solvent, the second organic solvent and a portion of the side wall of the accommodating portion close to the substrate all have a lyophilic property, the first organic solvent has a stronger lyophilic property and a higher boiling point than the second organic solvent;

when the first organic solvent and the second organic solvent both have a lyophilic property and the portion of the side wall of the accommodating portion close to the substrate has a lyophobic property, the second organic solvent has a stronger lyophilic property and a higher boiling point than the first organic solvent;

when the first organic solvent and the second organic solvent both have a lyophobic property and the portion of the side wall of the accommodating portion close to the substrate has a lyophilic property, the second organic solvent has a stronger lyophilic property and a higher boiling point than the first organic solvent; or, when the first organic solvent, the second organic solvent, and the portion of the side wall of the accommodating portion close to the substrate all have a lyophobic property, the first organic solvent has a stronger lyophilic property and a higher boiling point than the second organic solvent.

The pixel defining layer may include a first defining layer and a second defining layer, a portion of the side wall of the accommodating portion close to the substrate is the first defining layer, and a portion of the side wall of the accommodating portion away from the substrate is the second defining layer. For this case, the step of forming a pixel defining layer on a substrate and forming an accommodating portion in the pixel defining layer includes:

forming a first defining layer and a second defining layer on the substrate successively, and forming a pattern including the accommodating portion penetrating through the first defining layer and the second defining layer by a patterning process.

The first defining layer may have a lyophilic property, and the second defining layer may have a lyophobic property.

Specifically, the step of adding ink to the accommodating portion includes:

adding ink to the accommodating portion by an inkjet printing process.

In the ink, the first organic solvent has a smaller volume than the second organic solvent.

In the ink, a volume ratio of the first organic solvent to the second organic solvent is 1:1.5 to 1:9.

The method for manufacturing the OLED device may further include a step of forming an organic functional layer with the ink by using a vacuum freeze drying process.

The step of forming an organic functional layer with the ink by using a vacuum freeze drying process includes:

adjusting degree of vacuum of a vacuum freeze drying equipment, so that the solvents throughout the surface of the ink in the accommodating portion have the same evaporation speed, and thereby drying the ink to form the organic functional layer.

The ink further includes a solute, and the solute includes material for forming the organic functional layer.

Materials of the first defining layer include silicon compounds, such as silicon oxide or silicon nitride.

Materials of the second defining layer include polymer resins.

The present disclosure further provides an OLED device manufactured by the above method.

The present disclosure further provides a method for manufacturing an OLED display panel, including manufacturing the above OLED device.

The present disclosure further provides an OLED display panel, including the OLED device manufactured according to the above method.

Figure 1:
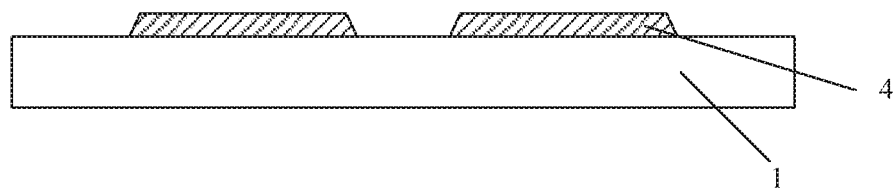
FIG. 1 is a section view of forming an anode in an embodiment of the present disclosure.

REFERENCE 1 substrate; 2 pixel defining layer; 21 first defining layer; 22 second defining layer; 31 first organic solvent; 32 second organic solvent; 33 solute; 4 first electrode; 5 second electrode; 6 organic functional layer

DETAILED DESCRIPTION OF THE EMBODIMENTS

In order that those skilled in the art can better understand the technical solutions of the present disclosure, the present disclosure will be further described in detail below in conjunction with the drawings and specific embodiments.

In the embodiment of the present disclosure, lyophilic property and lyophobic property are relative to the same liquid phase medium. For example, when the liquid phase medium is water, the lyophilic property and the lyophobic property are hydrophilic property and hydrophobic property; and when the liquid phase medium is oil, the lyophilic property and the lyophobic property are lipophilicity and lipophobicity.

Ink for an OLED device provided by the present disclosure includes a first solvent and a second solvent, and the first organic solvent and the second organic solvent have the same kind but different degrees of lyophilic property or lyophobic property, and the first organic solvent and the second organic solvent have different boiling points.

The first organic solvent and the second organic solvent constitute solvent in the ink together. Both of them should have good solubility to a solute for forming an organic functional layer, and they should be mutually soluble so as to ensure the stability of the ink in the process of forming the organic functional layer and the thickness uniformity of the formed organic functional layer.

The first organic solvent and the second organic solvent may have different lyophilic property or lyophobic property from a side wall (particularly a portion close to the substrate) of the accommodating portion in the OLED device.

For example, the first organic solvent and the second organic solvent both have a lyophilic property, and the portion of the side wall of the accommodating portion close to the substrate has a lyophobic property.

The first organic solvent and the second organic solvent may have the same kind of lyophilic property or lyophobic property with the side wall (particularly the portion close to the substrate) of the ink accommodating portion in the OLED device. For example, the first organic solvent and the second organic solvent both have a lyophilic property, and the portion of the side wall of the accommodating portion close to the substrate also has a lyophilic property. In this case, not only the first organic solvent is well miscible with the second organic solvent, but also the two solvents could be fully extended in the accommodating portion.

For example, when the side wall of the accommodating portion has a lyophilic property and both of the first organic solvent and the second organic solvent also have a lyophilic property, it is required that the first organic solvent has a stronger lyophilic property and a higher boiling point than the second organic solvent.

In this case, when the ink is added to the accommodating portion, the first organic solvent migrates to a position close to the side wall of the accommodating portion (that is, the edge portion of the ink in the accommodating portion) due to strong lyophilic property, and the second organic solvent is accordingly located at the center of the accommodating portion (that is, the central portion of the ink in the accommodating portion).

Meanwhile, since the first organic solvent has a higher boiling point than the second organic solvent, the evaporation speed of the solvent (the content of the first organic solvent is greater) located at the edge position of the ink in the accommodating portion is reduced in a subsequent ink drying process, so as to keep consistent with the evaporation speed of the solvent at the central position of the ink in the accommodating portion as much as possible. In this way, the solvent flow caused by the concentration difference can be avoided, thereby avoiding the uneven thickness of the organic functional layer due to the migration of the solute toward the edge position of the ink in the drying process, and thus the film thickness uniformity of the obtained organic functional layer is maximally guaranteed.

In the ink of the present disclosure, the first organic solvent has a smaller volume than the second organic solvent. That is to say, the first organic solvent 31 has a smaller volume ratio in the total solvent than the second organic solvent 32.

This is because, in the drying process, the area with a higher solvent evaporation speed (i.e. the edge position of the ink in the accommodating portion) occupies a smaller space than the area with the slower solvent evaporation speed (i.e. the central position of the ink in the accommodating portion).

Specifically, a suitable volume ratio of the first organic solvent to the second organic solvent is 1:1.5 to 1:9. That is to say, the first organic solvent accounts for 10% to 40% by volume of the total solvent, and the second organic solvent accounts for 60% to 90% by volume of the total solvent.

It can be understood that the volume ratio of the first organic solvent to the second organic solvent depends on the difference of the boiling points of the two solvents, and those skilled in the art could adjust the volume ratio of the first organic solvent to the second organic solvent according to practical application conditions. For example, when the difference of the boiling points between the two solvents is large, the amount of the first organic solvent could be reduced accordingly.

For example, when the side wall of the accommodating portion is a hydrophilic material, the first organic solvent may be selected from solvents having relatively higher boiling points, such as toluene, anisole, benzene, aromatic hydrocarbon or carbonate or the like; and the second organic solvent may be selected from acetone, diethyl ether, diethylene glycol monobutyl ether, aromatic ester or the like.

Depending on the specific material of the accommodating portion, those skilled in the art could select the suitable first solvent and second solvent and determine the volume ratio thereof in accordance with the above-described principles of the present disclosure.

Some embodiments of the present disclosure further provide an OLED device, including a substrate, an anode, a pixel defining layer, an organic light-emitting functional layer and a cathode, wherein the pixel defining layer has a first pixel defining layer close to the substrate and a second pixel defining layer away from the substrate, the first pixel defining layer and the substrate have the same kind of lyophilic property or lyophobic property to the ink for forming pixels, and the second pixel defining layer has a lyophilic property or lyophobic property which is opposite to that of the substrate and the first pixel defining layer to the ink for forming the pixels.

For example, when the substrate is a material having a lyophilic property to the ink for forming the pixels, the first pixel defining layer close to the substrate also has a lyophilic property to the ink for forming the pixels, while the second pixel defining layer away from the substrate has a lyophobic property to the ink for forming the pixels. On the contrary, when the substrate is a material having a lyophobic property to the ink for forming the pixels, the first pixel defining layer close to the substrate also has a lyophobic property to the ink for forming the pixels, but the second pixel defining layer away from the substrate has a lyophilic property to the ink for forming the pixels.

The material of the first defining layer 21 may include silicon oxide or silicon nitride; and the material of the second defining layer 22 may include polymer resin, specifically a fluorine-containing organic material such as polytetrafluoroethylene, polyvinylidene fluoride, and heptafluoroacrylate film, etc.

As shown in FIGS. 1 to 6, the present disclosure further provides a method for manufacturing an OLED device, the OLED device includes a substrate 1, and a first electrode 4, an organic functional layer 6 and a second electrode 5 arranged on the substrate successively; wherein one of the first electrode 4 and the second electrode 5 is a cathode while the other is an anode, and the organic functional layer 6 may include a hole injection layer, a hole transport layer, an organic light-emitting layer, an electron transport layer and an electron injection layer, which are successively arranged along the direction from the first electrode 4 to the second electrode 5.

For example, when the first electrode 4 is an anode and the second electrode 5 is a cathode, the method for manufacturing the OLED device according to the present disclosure includes the following steps:

S101, as shown in FIG. 1, forming an anode conductive film on the substrate 1 by using deposition process such as sputtering and forming a pattern including the anode by a patterning process.

The substrate 1 serves as a support of the electrode layers and the organic functional layer 6 in the OLED device. The substrate has good light transmittance in a visible light area and certain resistance to water vapor and oxygen permeation, as well as relatively good surface smoothness. Generally the substrate is made of glass, flexible material and the like. If the flexible material is adopted, the substrate may be made of polyesters, polyimide or thinner metals.

The anode serves as a connecting layer of the OLED device to a forward voltage, and it has good electrical conductivity, light transmittance in the visible light area and a higher work function. The anode is usually made of an inorganic metal oxide (for example, indium tin oxide (ITO), zinc oxide (ZnO) or the like), an organic conductive polymer, or a metal material having a high work function (for example, gold, copper, silver, platinum or the like).

Figure 2:
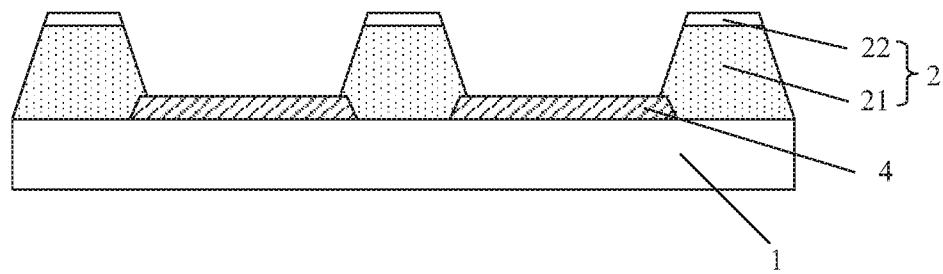
FIG. 2 is a section view of forming a pixel defining layer in an embodiment of the present disclosure.

S102, as shown in FIG. 2, forming a pixel defining layer 2 on the substrate 1 by a patterning process and forming accommodating portions in the pixel defining layer 2.

The accommodating portion is an opening in the pixel defining layer 2 for accommodating ink in which the material of the organic functional layer 6 of the OLED device is dissolved. In the present embodiment, the side wall of the accommodating portion is divided into two portions, one portion close to the substrate and the other portion away from the substrate. The two portions have attractive property (lyophilic property) and repulsive property (lyophobic property) respectively for the same liquid phase medium. The portion of the side wall of the accommodating portion close to the substrate refers to a portion of the side wall of the accommodating portion is wetted in the preparation process by contacting with the ink for immersion.

It should be understood that the portion of the side wall of the accommodating portion away from the substrate refers to a portion excluding the portion of the side wall of the accommodating portion close to the substrate.

Specifically, for example, when the portion of the side wall of the accommodating portion away from the substrate 1 (upper portion of the side wall) has a lyophobic property, the portion close to the substrate 1 (lower portion of the side wall) has a lyophilic property and the ink dissolving material for forming the organic functional layer 6 also has a lyophilic property. Meanwhile, the substrate 1 is made of a material having a lyophilic property such as glass. In this case, the bottom of the accommodating portion and the lower portion of the side wall of the accommodating portion both are attractive to the ink having lyophilic property. On one hand, when the ink is added to the accommodating portion, the ink would sufficiently spread in the accommodating portion, thereby avoiding a pinhole current leakage phenomenon caused by incomplete ink spreading. On the other hand, the upper portion of the side wall of the accommodating portion is repulsive to the material for forming the organic functional layer 6, so that the material for forming the organic functional layer 6 is not liable to overflow from the accommodating portion.

In the present embodiment, the pixel defining layer 2 includes a first defining layer 21 and a second defining layer 22, wherein the portion of the side wall of the accommodating portion close to the substrate is the first defining layer 21 having a lyophilic property, the portion of the side wall of the accommodating portion away from the substrate is the second defining layer 22 having a lyophobic property.

The step of forming a pixel defining layer 2 and forming accommodating portions in the pixel defining layer 2 may include:

forming a first defining layer 21 and a second defining layer 22 on the substrate 1 successively; and forming a pattern including accommodating portions penetrating through the first defining layer 21 and the second defining layer 22 by a patterning process.

The material of the first defining layer 21 may include silicon oxide or silicon nitride; the material of the second defining layer 22 may include polymer resin, specifically a fluorine-containing organic material such as polytetrafluoroethylene, polyvinylidene fluoride, a heptafluoroacrylate film or the like.

S103, mixing a solute 33 with a first organic solvent 31 and a second organic solvent 32 to form a ink to be used.

When the first organic solvent 31, the second organic solvent 32 and the portion of the side wall of the accommodating portion close to the substrate 1 all have a lyophilic property, the first organic solvent 31 has a stronger lyophilic property and a higher boiling point than the second organic solvent 32.

When the first organic solvent 31 and the second organic solvent 32 both have a lyophilic property and the portion of the side wall of the accommodating portion close to the substrate 1 has a lyophobic property, the second organic solvent 32 has a stronger lyophilic property and a higher boiling point than the first organic solvent 31.

When the first organic solvent 31 and the second organic solvent 32 both have a lyophobic property and the portion of the side wall of the accommodating portion close to the substrate 1 has a lyophilic property, the second organic solvent 32 has a stronger lyophobic property and a higher boiling point than the first organic solvent 31.

When the first organic solvent 31, the second organic solvent 32 and the portion of the side wall of the accommodating portion close to the substrate 1 all have a lyophobic property, the first organic solvent 31 has a stronger lyophobic property and a higher boiling point than the second organic solvent 32.

The solute 33 comprises materials for forming the organic functional layer 6. Since the organic functional layer 6 in the present embodiment comprises multiple layers such as a hole injection layer, a hole transport layer, an organic light emitting layer, an electron transport layer, an electron injection layer and the like, the solute 33 in the ink differs depending on the specific layer of the organic functional layer 6.

The first organic solvent 31 and the second organic solvent 32 constitute a solvent in the ink, and they have good solubility to the solute 33 and are mutually soluble to ensure the stability of the ink during the preparation of the organic functional layer 6 and the film thickness uniformity of the obtained organic functional layer 6.

Optionally, the first organic solvent 31, the second organic solvent 32 and the portion of the side wall of the accommodating portion close to the substrate 1 may have the same kind of lyophilic property or lyophobic property, so that the first organic solvent 31 and the second organic solvent 32 could sufficiently extend in the accommodating portion while being well mixed with each other. Specifically, using the lower portion of the side wall of the accommodating portion having a lyophilic property as example, the first organic solvent 31 and the second organic solvent 32 also have a lyophilic property, and the first organic solvent 31 has a stronger lyophilic property and a higher boiling point than the second organic solvent 32.

In this case, when the ink is added into the accommodating portion, the first organic solvent 31 in the accommodating portion spontaneously moves to a position close to the side wall of the accommodating portion (i.e. the edge portion of the ink in the accommodating portion), and the second organic solvent 32 is remained at the center of the accommodating portion (i.e. the central portion of the ink in the accommodating portion) relative to the first organic solvent 31.

Further, Since the two organic solvents have different boiling points (i.e. the first organic solvent 31 having a higher boiling point and the second organic solvent 32 having a lower boiling point), the evaporation speed of the solvent located at the edge portion of the ink (the first organic solvent 31) in the accommodating portion is slower when the ink is subsequently dried to form the organic functional layer 6, so that the evaporation speed of the solvent located at the edge position in the accommodating portion could be kept consistent with the evaporation speed of the solvent at the central position as much as possible, therefore the solvent at the central position of the ink in the accommodating portion could be prevented from flowing toward the edge position due to the concentration difference in the drying process, thereby avoiding the accumulation of the solute 33 due to the migration in the drying process, and further ensuring the film thickness uniformity of the formed organic functional layer 6 maximally In the ink, the first organic solvent 31 has a smaller volume than the second organic solvent 32. That is to say, the first organic solvent 31 has a smaller volume percent in the total solvent than the second organic solvent 32. In the present embodiment, the high boiling point of the first organic solvent 31 which is located at the edge position of the ink in the accommodating portion results in a slower evaporation speed of the solvent at the edge position of the ink. In the actual situation, the space occupied by the solvent with the higher evaporation speed (i.e. the edge position of the ink in the accommodating portion) is smaller than the space occupied by the solvent with the lower solvent evaporation speed (i.e. the central position of the ink in the accommodating portion), so that the volume percent of the first organic solvent 31 needs not be too much and may be smaller than that of the second organic solvent 32. Specifically, the first organic solvent 31 to the second organic solvent 32 has a volume ratio is the range of 1:1.5 to 1:9. Generally, the volume percent of the first organic solvent 31 may be 10% to 40%, and the volume percent of the second organic solvent 32 may be 60% to 90%.

It can be understood that, the volume percent of the first organic solvent 31 and the second organic solvent 32 depends on the difference of the boiling points of the two solvents and could be adjusted specifically according to practical application conditions. For example, when the difference of the boiling points between the two solvents is larger, the volume percent of the first organic solvent 31 should be appropriately reduced.

In other embodiments, when the first organic solvent and the second organic solvent in the ink have a lyophilic property and the portion of the side wall of the accommodating portion close to the substrate has a lyophobic property, it is required that the second organic solvent has a stronger lyophilic property and a higher boiling point than the first organic solvent.

In this case, when the ink is added to the accommodating portion, the second organic solvent 32 in the accommodating portion spontaneously moves to a position close to the side wall of the accommodating portion (i.e. the edge portion of the ink in the accommodating portion), and the first organic solvent 31 is relatively remained at the center of the accommodating portion (i.e. the central portion of the ink in the accommodating portion). Further, since the boiling point of the second organic solvent 32 is higher than that of the first organic solvent 31, when the organic functional layer 6 is subsequently formed by drying the ink, the evaporation speed of the solvent located at the edge position in the accommodating portion (i.e. the second organic solvent 32) is slowed down, so that the evaporation speed of the solvent at the edge position in the accommodating portion is kept consistent with the evaporation speed of the solvent at the central position as much as possible, thereby avoiding the accumulation caused by the migration of the solute 33 in the drying process and maximally ensuring the film thickness uniformity of the formed organic functional layer 6.

In other cases, those skilled in the art could select suitable organic solvents depending on the property of the accommodating portion according to the above-described principles of the present disclosure, and could adjust the volume ratio of the two solvents accordingly.

Figure 3:
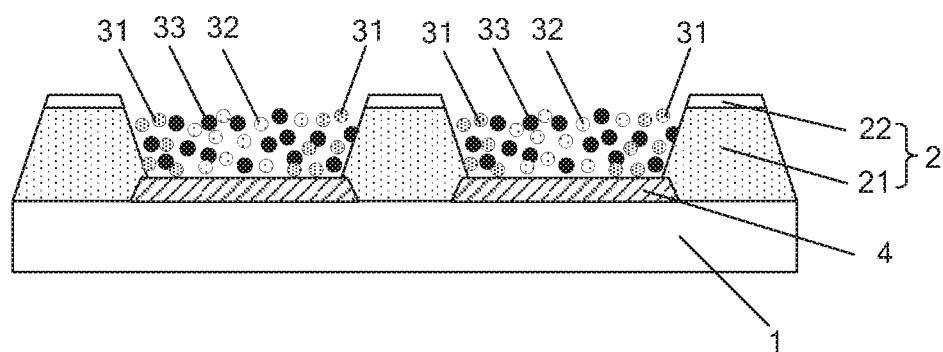
FIG. 3 is a section view after ink is added to an accommodating portion of a pixel defining layer in an embodiment of the present disclosure.

S104, adding the ink to the accommodating portions, as shown in FIG. 3.

Specifically, the ink is printed to the pixel defining layer 2 on the substrate 1 by an inkjet printing process so as to add the ink into the accommodating portion of the pixel defining layer 2.

Figure 4:
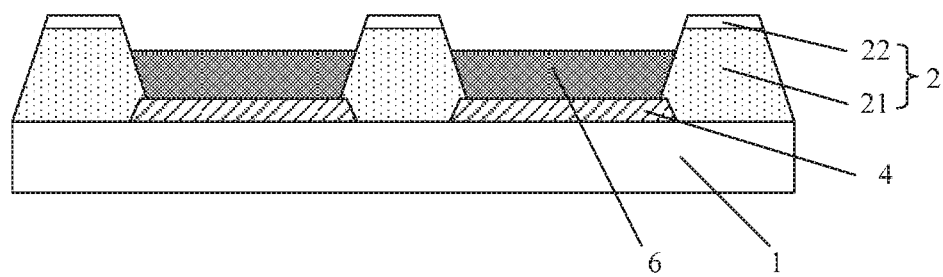
FIG. 4 is a section view of forming an organic functional layer in an embodiment of the present disclosure.

S105, forming the organic functional layer 6 with the ink by a vacuum freeze drying process, as shown in FIG. 4.

Additives such as the first organic solvent 31 and the second organic solvent 32 in the ink in the accommodating portion are removed by a vacuum freeze drying process to form the organic functional layer 6.

Specifically, the substrate 1 added with the ink in the accommodating portion is transferred to a vacuum drying equipment for drying, so that the first organic solvent 31 and the second organic solvent 32 are evaporated to obtain the organic functional layer 6. In the case that the first organic solvent, the second organic solvent and the portion of the side wall of the accommodating portion close to the substrate all have a lyophilic property, since the lyophilic property and the boiling point of the first organic solvent 31 at the edge position of the ink are higher than those of the second organic solvent 32 at the central position of the ink, the difference of the solvent evaporation speeds at the edge position of the ink and the central position of the ink during the vacuum drying process in the present embodiment is much smaller than the difference of the solvent evaporation speeds in the prior art. The smaller different of the solvent evaporation speeds effectively reduces the migration of the solvent in the drying process, so that the accumulation of the solute 33 is avoided and the distribution uniformity thereof is improved, thereby improving the film thickness uniformity of the formed organic functional layer 6.

Further, the step of forming the organic functional layer 6 with the ink by using the vacuum freeze drying process includes: adjusting the vacuum degree of the vacuum freeze drying equipment to make the evaporation speed of the solvent throughout the surface of the ink all the same. The ink in the accommodating portion is dried to form the organic functional layer 6. The surface of the ink in the accommodating portion refers to a surface (evaporation surface) in which the ink contacts with a vacuum space in the vacuum freeze drying equipment, rather than a surface in contact with the side wall of the accommodating portion. In this step, by adjusting the vacuum degree of the vacuum freeze drying equipment in the vacuum freeze drying process, the boiling points of the first organic solvent 31 and the second organic solvent 32 are changed so as to further adjust the evaporation speeds of the first organic solvent 31 and the second organic solvent 32, further to ensure the film thickness uniformity of the formed organic functional layer 6.

Different layer structures of the organic functional layer 6 (i.e. the hole injection layer, the hole transport layer, the electron injection layer and the electron transport layer) are similarly formed according to the steps S103 to S105. Depending on the structure of the organic functional layer 6, the solute 33 and the solvent in the ink are adjusted accordingly.

Figure 5:
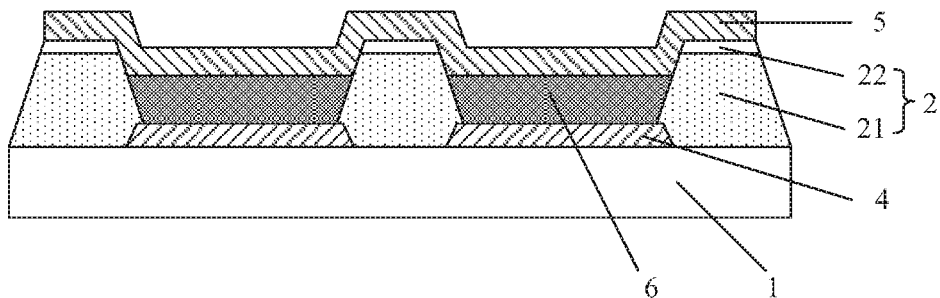
FIG. 5 is a section view of forming a cathode in an embodiment of the present disclosure.
Figure 6:
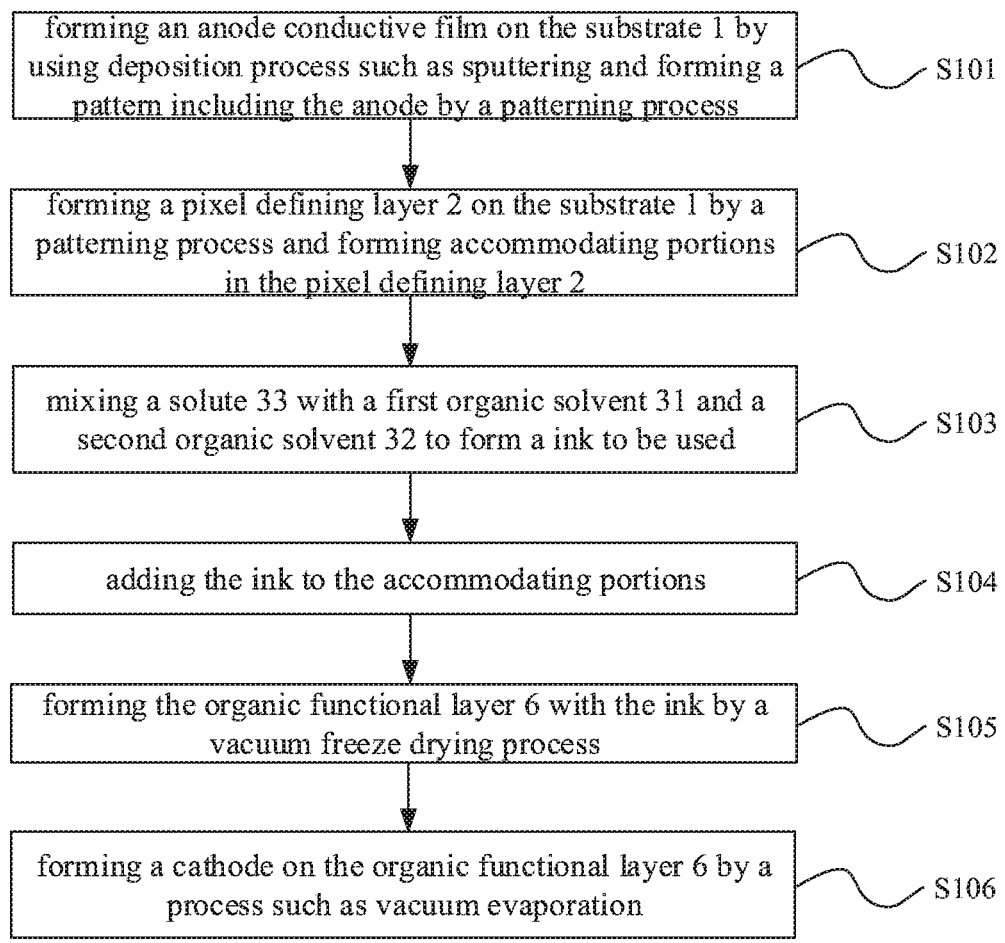
FIG. 6 is a flowchart of a method for manufacturing an OLED device in an embodiment of the present disclosure.

S106, forming a cathode on the organic functional layer 6 by a process such as vacuum evaporation, as shown in FIG. 5.

The cathode serves as a connecting layer of the organic electroluminescence device to a negative voltage and has a good electrical conductivity and a lower work function. The cathode is usually made of a low work function metal material such as lithium, magnesium, calcium, strontium, aluminum, indium and the like or an alloy of the above metal with copper, gold or silver; or the cathode is consisted of a very thin buffer insulating layer (such as lithium fluoride (LiF), cesium carbonate (CsCO3) or the like) and the above metals or alloys.

The OLED device of the present disclosure is thus obtained.

In the method for manufacturing the OLED device provided by some embodiments of the present disclosure, when the organic functional layer 6 in the OLED device is formed, the first organic solvent 31 and the second organic solvent 32 which have a lyophilic property similar as the portion of the side wall of the accommodating portion close to the substrate 1 are selected to serve as the solvents of the material for forming the organic functional layer 6, wherein the first organic solvent 31 has a stronger lyophilic property and a higher boiling point than the second organic solvent 32. Therefore, when the ink is dropped into the accommodating portion, the first organic solvent 31 is located at the edge position of the ink, and the second organic solvent 32 is located at the central position of the ink. Further, when the ink is dried to form the organic functional layer 6, since the boiling point of the first organic solvent 31 is higher, the evaporation speed of the solvent at the edge position of the ink (i.e., the first organic solvent 31) can be slowed down in the drying process to prevent the solvent at the central position of the ink from flowing toward the edge position due to the concentration gradient difference, and the film thickness uniformity of the formed organic functional layer 6 is maximally guaranteed.

Some embodiments of the present disclosure further provide a method for manufacturing an OLED display panel, including the method for manufacturing above OLED device.

It can be understood that the above embodiments are merely exemplary embodiments employed to explain the principles of the present disclosure, but the present disclosure is not limited thereto. Various modifications and improvements can be made by those of ordinary skill in the art without departing from the spirit and essence of the present disclosure, and these modifications and improvements are also encompassed within the protection scope of the present disclosure.

The invention claimed is:

1. An ink for an OLED device, comprising a first organic solvent and a second organic solvent, wherein the first organic solvent and the second organic solvent have a same kind of lyophilic property or lyophobic property, and the first organic solvent and the second organic solvent have different boiling points and different degrees of lyophilic property or lyophobic property; wherein
when the first organic solvent, the second organic solvent and a portion of a side wall of an accommodating portion close to a substrate all have a lyophilic property, the first organic solvent has a stronger lyophilic property and a higher boiling point than the second organic solvent,
when the first organic solvent and the second organic solvent both have a lyophilic property and the portion of the side wall of the accommodating portion close to the substrate has a lyophobic property, the second organic solvent has a stronger lyophilic property and a higher boiling point than the first organic solvent;
when the first organic solvent and the second organic solvent both have a lyophobic property and the portion of the side wall of the accommodating portion close to the substrate has a lyophilic property, the second organic solvent has a stronger lyophilic property and a higher boiling point than the first organic solvent; or, when the first organic solvent, the second organic solvent, and the portion of the side wall of the accommodating portion close to the substrate all have a lyophobic property, the first organic solvent has a stronger lyophilic property and a higher boiling point than the second organic solvent.

2. An OLED device, comprising the substrate, an anode, a pixel defining layer, an organic light emitting functional layer and a cathode, wherein the organic light emitting functional layer is prepared by the ink according to claim 1.

3. The OLED device according to claim 2, wherein the pixel defining layer has a first pixel defining layer close to the substrate and a second pixel defining layer away from the substrate, the first pixel defining layer and the substrate have the same kind of lyophilic property or lyophobic property to the ink for forming pixels, and the second pixel defining layer has a lyophilic property or lyophobic property to the ink for forming the pixels which is opposite to that of the substrate and the first pixel defining layer.

4. An OLED display panel, comprising the OLED device according to claim 2.

5. A method for manufacturing the OLED device according to claim 2, comprising:
   forming the pixel defining layer on the substrate and forming accommodating portions in the pixel defining layer;
   adding the ink to the accommodating portions to form the organic functional layer of the OLED device.

6. The method for manufacturing the OLED device according to claim 5, wherein
   the pixel defining layer comprises a first defining layer and a second defining layer, the portion of the side wall of the accommodating portion close to the substrate is the first defining layer, and a portion of the side wall of the accommodating portion away from the substrate is the second defining layer; and
   the step of forming the pixel defining layer on the substrate and forming accommodating portions in the pixel defining layer includes:
   forming the first defining layer and the second defining layer on the substrate successively, and forming a pattern including the accommodating portions penetrating through the first defining layer and the second defining layer by a patterning process, wherein the first defining layer has a lyophilic property and the second defining layer has a lyophobic property.

7. The method for manufacturing the OLED device according to claim 5, wherein the step of adding the ink to the accommodating portions specifically comprises:
   adding the ink to the accommodating portions by an inkjet printing process.

8. The method for manufacturing the OLED device according to claim 5, wherein the first organic solvent has a smaller volume in the ink than the second organic solvent.

9. The method for manufacturing the OLED device according to claim 8, wherein a volume ratio of the first organic solvent and the second organic solvent in the ink is 1:1.5 to 1:9.

10. The method for manufacturing the OLED device according to claim 5, further comprising a step of forming the organic functional layer with the ink by using a vacuum freeze drying process.

11. The method for manufacturing the OLED device according to claim 10, wherein the step of forming the organic functional layer with the ink by using a vacuum freeze drying process comprises:
    adjusting the vacuum degree of a vacuum freeze drying equipment, so that the evaporation speed of the solvent throughout the surface of the ink in the accommodating portions is the same, and thereby drying the ink to form the organic functional layer.

12. The method for manufacturing the OLED device according to claim 5, wherein the ink further includes a solute comprising material for forming the organic functional layer.

13. The method for manufacturing the OLED device according to claim 10, wherein the material of the first defining layer comprises silicon oxide or silicon nitride.

14. The method for manufacturing the OLED device according to claim 6, wherein the material of the second defining layer comprises polymer resin.

15. A method for manufacturing an OLED display panel, comprising the method for manufacturing the OLED device according to claim 5.

\* \* \* \* \*